United States Patent [19]

Zambrano

[11] Patent Number: 5,013,672
[45] Date of Patent: May 7, 1991

[54] MANUFACTURING PROCESS FOR HIGH-FREQUENCY BIPOLAR TRANSISTORS

[75] Inventor: Raffaele Zambrano, Mercato San Severino, Italy

[73] Assignee: SGS-Thomson Microelectronics s.r.l., Agrate Brianza, Italy

[21] Appl. No.: 259,261

[22] Filed: Oct. 18, 1988

[30] Foreign Application Priority Data

Oct. 23, 1987 [IT] Italy .................................. 22392 A/87

[51] Int. Cl.⁵ .......................................... H01L 21/331
[52] U.S. Cl. ......................................... 437/33; 437/73; 437/28; 148/DIG. 103
[58] Field of Search ....................... 437/33, 28, 55, 31, 437/32, 69, 70, 73; 148/DIG. 103

[56] References Cited

U.S. PATENT DOCUMENTS

| | | | |
|---|---|---|---|
| 3,963,524 | 6/1976 | Graul et al. | 437/33 |
| 4,082,571 | 4/1978 | Graul et al. | 437/55 |
| 4,110,779 | 8/1978 | Rathbone et al. | 437/33 |
| 4,143,455 | 3/1979 | Schwabe et al. | 437/33 |
| 4,199,380 | 4/1980 | Farrell et al. | 437/55 |
| 4,498,227 | 2/1985 | Howell et al. | 437/33 |

OTHER PUBLICATIONS

Ko, W. C., *IEEE Trans. Elect. Devices*, vol. Ed-30, No. 3, Mar. 1983, pp. 236-239.
EP 88 20 2260 The Hague.

*Primary Examiner*—Brian E. Hearn
*Assistant Examiner*—T. N. Quach
*Attorney, Agent, or Firm*—Sixbey, Friedman, Leedom & Ferguson

[57] ABSTRACT

The process calls for determination of the contact areas occupied by the collector, emitter and base implantations by selective removal of a layer of oxidation resistant material only from said contact areas and not from the separating zones between said areas.

3 Claims, 4 Drawing Sheets

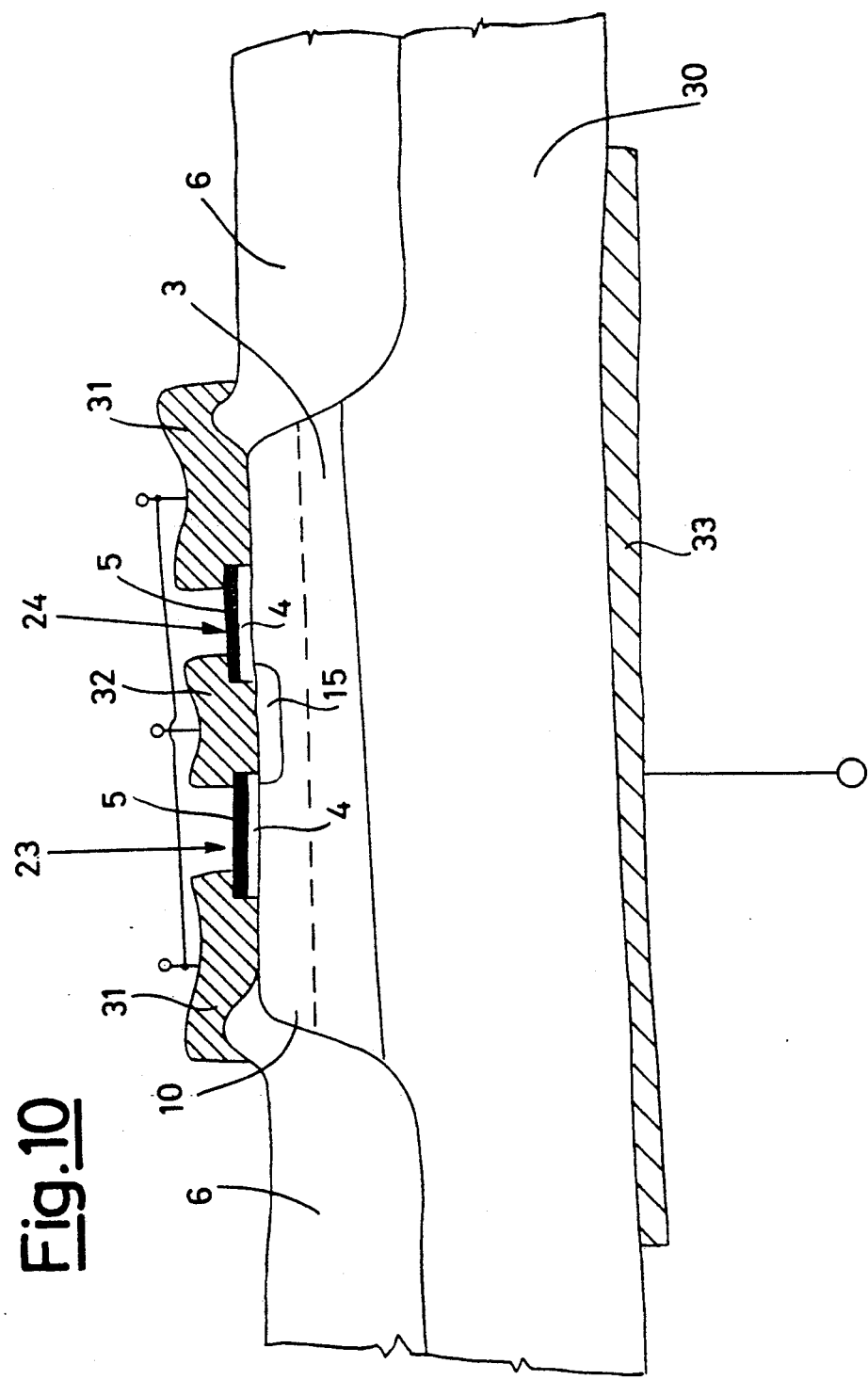

MANUFACTURING PROCESS FOR HIGH-FREQUENCY BIPOLAR TRANSISTORS

TECHNICAL FIELD

The present invention relates to a manufacturing process for high-frequency transistors.

BACKGROUND

Numerous structures for integrated npn transistors are known which call for creation of a lateral dielectric insulation by selective thermal oxidation of a silicon substrate.

The transistors manufactured in accordance with this selective oxidation technique are able to reach very high cutoff frequencies even on the order of GHz.

It is known that high-frequency performance is limited by the base distributed resistance (rbb') and by the parasite capacitances associated with the collector junction (Cc) and the emitter junction (Ce).

Known structures fall into three classes, i.e. (a) transistors with low Cc and high rbb', (b) transistors with high Cc and low rbb', and (c) transistors with intermediate Cc and rbb' values.

A structure of type (a) is proposed for example by Ko and others and described in the journal "IEEE Transactions on Electron Devices" of March 1983.

A manufacturing process conceived to reduce the number of process and masking steps for said structure is described.

In accordance with said process a substrate of p silicon is oxidized and, with a mask, a buried layer is produced which is then subjected to antimony diffusion. On the substrate thus treated is grown an epitaxial layer on which is grown a thin layer of thermal oxide and silicon nitride is deposited. An oxide insulation is formed by silicon etching, field implanting and oxidation. Then a self-aligning mask is applied to determine the contact areas of the transistor by selectively removing the nitride layer. The exposed area is oxidated to form a self-aligning oxide layer. The nitride layer is subsequently removed. The collector contact region is created by phosphorus implantation and the base region by boron implantation.

After removal of the photoresist the emitter mask is applied to determine the emitter implantation region. The photoresist is then removed and a single thermal cycle is performed for annealing and penetration of the base and emitter implantations. The self-aligning diagram used produces with each contact thin layers of oxide which are removed by short open sky etching. Lastly follows evaporation of the metal.

The shortcoming of this structure is that the region separating the base contact from the "intrinsic" base (the base region under the emitter), hereinafter called extrinsic base region, is a high-resistivity region because the oxide present over this region partially screens the boron implantation of the base.

In other type (c) structures, before oxidizing the areas not covered with nitride, boron is implanted. Precisely, as described in U.S. Pat. No. 4,199,380, an oxidation resistant layer ($Si_3N_4$) is applied on a layer of thermal oxide grown on the epitaxial layer. Self-aligning openings are created in said resistant layer to expose portions of the epitaxial layer. Said openings determine the spaces between the contacts of the active elements of the circuit. Impurities of a first type (boron) are then applied through a subsequent masking to form the basic extrinsic region in a portion of said silicon substrate. Then the silicon zones are oxidized to form a layer of relatively thick self-aligned oxide. The oxidation resistant layer is then removed to expose those portions of the epitaxial layer where the active regions are to be formed. Appropriate doping impurities are applied to form the intrinsic base region, the emitter regions and the collector contact regions. Then the implantations of said impurities are redistributed by means of thermal cycles.

The shortcoming which occurs in this structure is that the extrinsic base region sees the growth of a quite thick oxide layer which reduces considerably the boron concentration near the silicon/silicon oxide interface because of segregation of the boron in the oxide. This circumstance increases the value of the rbb' and can also originate inverted surface layers. In addition, the depth of the junction of the extrinsic base region is greater than that of the intrinsic base and this produces an increase of the Cc.

In type (b) structures, in addition to recording very high values for both the capacitances Cc and Ce, a decrease in the current flow is brought about. Indeed, the breakdown of the collector junction is caused by the minimum thickness of the low-concentration collector while the current flow is inversely proportionate to the low-concentration collector under the intrinsic base. In this type of transistor the low-concentration collector under the intrinsic base is always thicker than elsewhere. This effect is also present in type (c) structures although in a less pronounced manner.

In all the known structures described there is also the possibility of short circuits induced by the metallization between the emitter and base regions as a result of the contact opening process.

From the art there is also known a manufacturing process for a bipolar npn transistor which uses a thick layer of silicon dioxide to insulate the transistor.

The starting material is a lightly doped type p silicon substrate which is oxidized and in which is produced a buried layer; then a type n epitaxial layer is grown. On the latter layer is grown a layer of silicon dioxide on which is then deposited a layer of silicon nitride. Then masking and etching of the nitride and oxide layers and of the silicon itself are performed to approximately half of the epitaxial layer. At this point boron is implanted. The resist is removed and the wafers are oxidized so that all the remaining epitaxial layer not protected by the nitride is converted into silicon dioxide. At this point the nitride is totally removed. The base can be implanted through the oxide. The contact areas of the base, emitter and collector regions can be determined simultaneously with a single mask. While the emitter and collector contact regions are implanted, a mask is used to protect the base contact area. After the emitter has been implanted it is brought to the desired depth in a nonoxidizing environment. The thin oxide which is formed on the emitter, base and collector contacts can be removed in a dilute solution of hydrofluoric acid.

After removal of the thin oxide a new layer of silicon nitride can be deposited on the wafer to protect the device from contaminating ions. This layer can be selectively anodized to avoid resorting to a further photolithographic process to open the contact regions.

Summing up, the transistors obtained by the above process present the following shortcomings. (1) the base region does not have uniform junction depth and consequently the junction is not completely flat and has high Cc, (2) the current flow is not maximal since the junction of the extrinsic base region is deeper than that of the intrinsic base, (3) segregation of the boron occurs in the oxide (type c structure), (4) the boron concentration increases in the region between the intrinsic and extrinsic bases (type b and c structures), and (5) etching of the thin oxide which forms after diffusion of the emitter creates short circuit problems between the emitter and the base induced by the metallization.

SUMMARY OF THE INVENTION

The object of the present invention is to produce an integrated high-frequency transistor by a manufacturing process which would eliminate or reduce the above shortcomings.

In accordance with the invention said object is achieved by a process for the manufacture of high-frequency transistors comprising diffusion of a buried layer on a suitable substrate, growth of an epitaxial layer on said buried layer and said substrate, growth on the epitaxial layer of a thin layer of thermal oxide and on the latter deposit of oxidation resistant material, determination and oxidation of insulating regions, determination of a base region and implantation therein of a doping element passing through the layers of oxidation resistant material and thin oxide, determination of the contact areas, collector implantation, emitter implantation, annealing and penetration in one or more successive steps of the base, collector and emitter implantations, and metallization, characterized in that in the phase of determination of the contact areas the oxidation resistant material is removed from said contact areas while exercising care not to remove it from the separating zones between said areas.

By such a process the separating zones between the contacts remain permanently covered by the layer of oxidation resistant material, providing protection of the zones between the contacts, which is useful in the contact opening phase and later because the layer of oxidation resistant material comprises an effective barrier against penetration of contaminating and/or corrosive agents.

Implantation of the base region is also perfomed at uniform depth. This gives a flat junction with resulting reduction of the Cc.

The low-concentration collector region also has a constant thickness all over so that the above shortcoming of reduction of the current flow encountered in the type (b) and (c) structures described is eliminated.

BRIEF DESCRIPTION OF THE DRAWINGS

The process in accordance with the invention is illustrated in detail in the annexed drawings wherein FIG. 10 shows a discrete transistor produced by the above process.

DETAILED DESCRIPTION OF THE PREFERRED EMBODIMENTS

Figure 1:
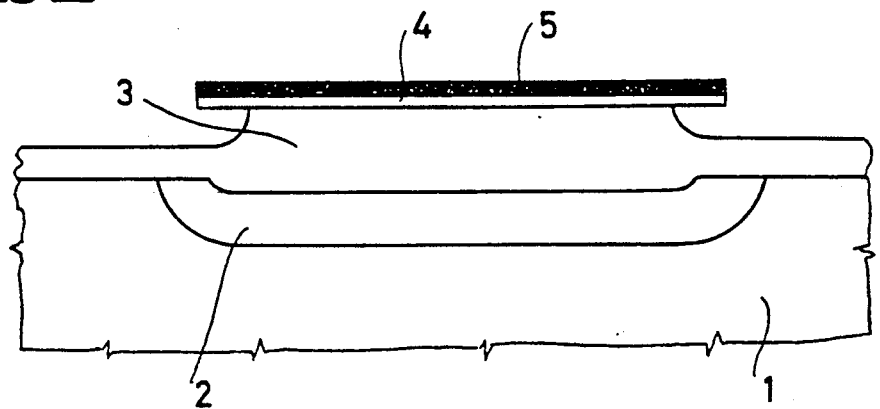
FIGS. 1-9 show schematically successive phases of the above process used as an example for manufacture of an integrated high-frequency transistor.

FIG. 1 shows a structure in which masking and diffusion of a buried layer 2 have been performed on a substrate on which an epitaxial layer 3 is subsequently grown. On the latter a thin layer of thermal oxide 4 is then grown and thereon is deposited a layer of oxidation resistant material 5, e.g. silicon nitride ($Si_3N_4$).

After these phases, which are performed in a known manner, the insulating regions are determined, etching in these regions the layers 5 and 4 and part of the epitaxial layer 3, so that the structure appears as shown in FIG. 1.

The next phase is that of the field implantation 8 to raise the doping level of the thin substrate under the insulating regions.

Figure 2:
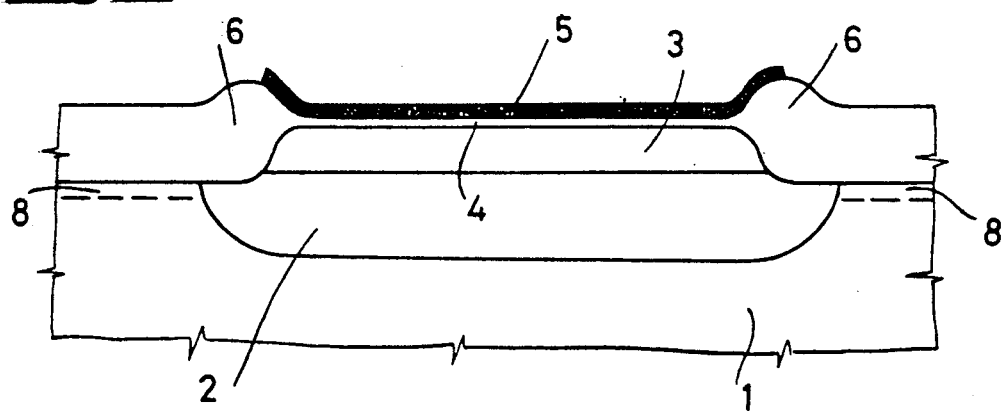

There then follows an oxidation phase which causes growth of the insulating regions 6. The structure appears as shown in FIG. 2.

Figure 3:
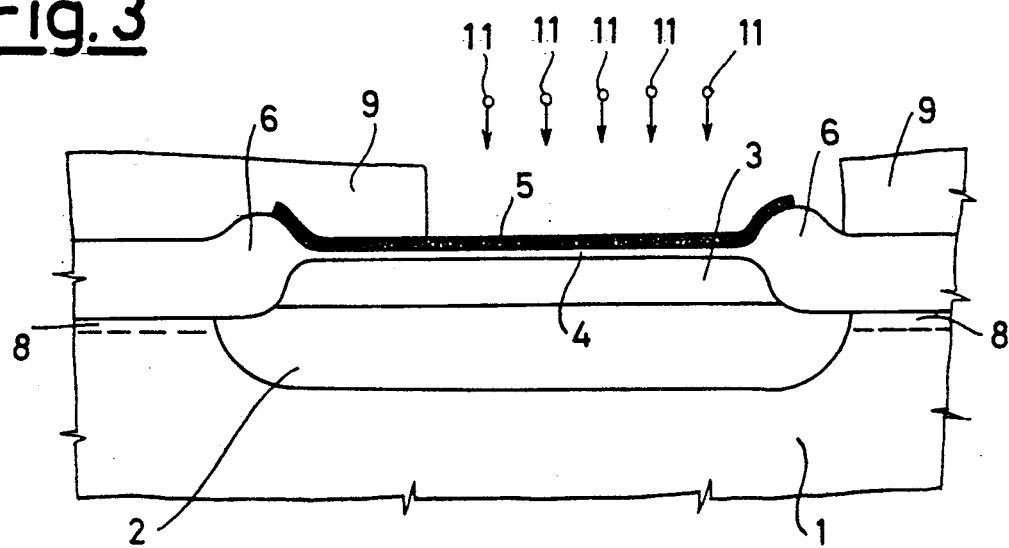
Figure 4:
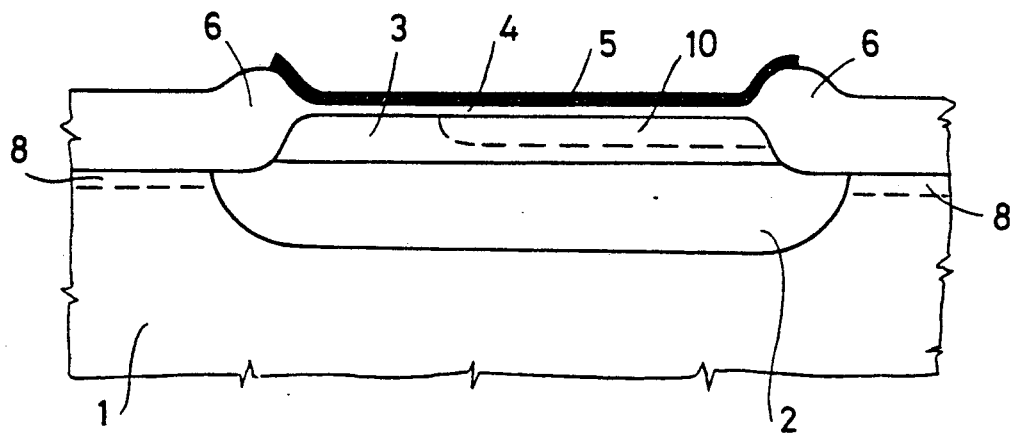
Figure 5:
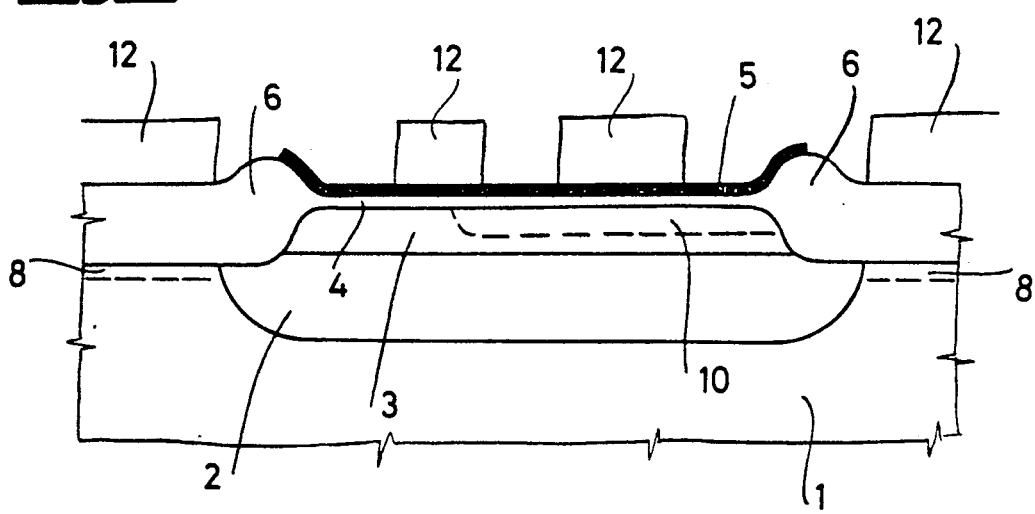

On the structure is applied a mask 9 which determines the base region 10 to be realized by boron implantation. The boron ions 11 are energized in such a manner as to pass through the oxidation resistant layer 5 and the thermal oxide layer 4 (FIG. 3). It should be noted that the oxidation resistant layer 5 has not yet been etched except in phase 1. Once the boron implantation 11 has been performed the mask 9 is removed, the base region 10 is diffused (FIG. 4), and a mask 12 is positioned (FIG. 5) to determine the contact areas 20, 21 and 22, from which is to be selectively removed the layer of oxidation resistant material 5.

Figure 6:
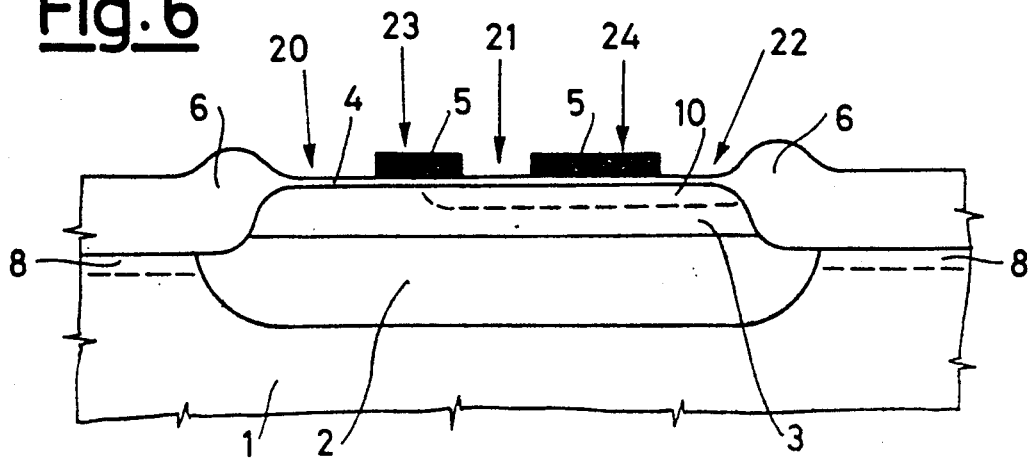

As may be seen in FIG. 6 the layer of oxidation resistant material 5 is not removed from the zones 23, 24 which separate the contact areas 20, 21, 22 designed to be occupied by the collector, emitter and base implantations.

Figure 7:
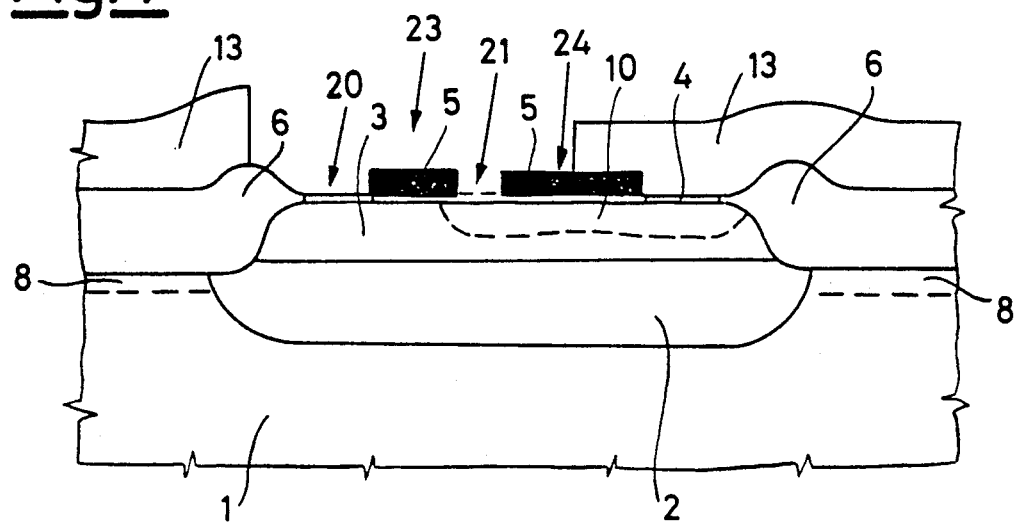
Figure 8:
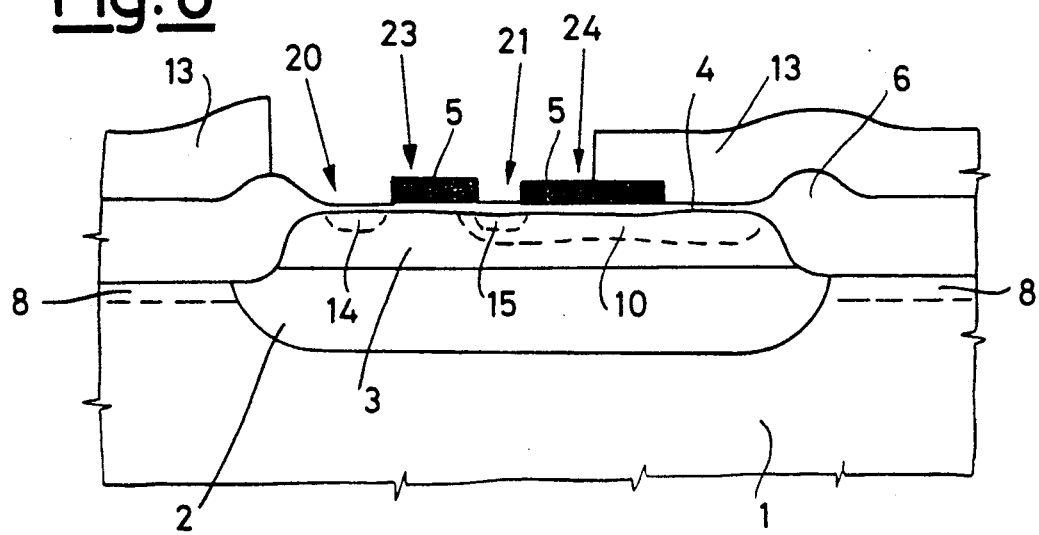

The following phase calls for positioning of another mask 13 (FIG. 7) to screen the zones not affected by the collector implantation 14 and emitter implantation 15 (FIG. 8).

Figure 9:
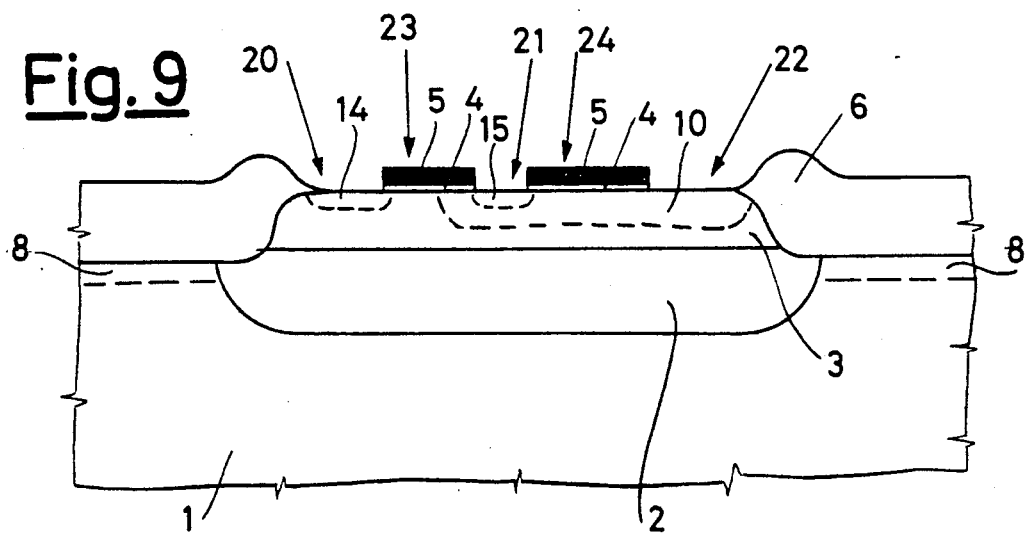

After removal of the mask 13 and annealing and penetration of the collector implantation 14 and emitter implantation 15, the thermal oxide layer 4 is selectively eliminated from the surface of the structure, providing the structure shown in FIG. 9.

A subsequent phase of metallization of the contacts (not shown) completes the process.

The above process is only an example and modifications may be made thereto. For example the field implantation can be self-aligned with the buried layer rather than with the insulating layer, or a thick layer of insulating oxide can be grown between the collector and emitter contact areas.

Other examples of possible modifications are substitution of the planox oxide insulating by a trench insulation and simultaneous diffusion of the base and emitter.

The same criterion of determination of the contact areas is applicable in the manufacture of a discrete transistor such as the one shown in FIG. 10.

In this case one starts from a type n+ substrate 30, on which are grown an epitaxial layer 3 and then a thin layer of thermal oxide 4. On the latter is deposited the layer of oxidation resistant material 5. Then in a manner similar to what was described above, the base contact area 10 and the emitter contact area 15 are determined and doped without removing the layer of material 5 from the separating zones 23 and 24 between said contact areas. On said contact areas the base contact 31 and emitter contact 32 are then applied by metallization while the collector contact 33 is provided under the substrate.

I claim:

1. A process for manufacturing high-frequency transistors which comprises a succession of steps including:
    diffusing a buried layer into an appropriate substrate;

growing an epitaxial layer on said buried layer and said substrate;

growing a thin layer of thermal oxide on said epitaxial layer;

depositing an oxidation resistant material on said thin oxide;

determining and oxidizing insulating regions;

determining a base region in the epitaxial layer and implanting therein a doping agent passing through said oxidation resistant material and thin oxide layers;

removing the oxidation resistant material except portions in separating zones between contact areas on the substrate;

implanting collector and emitter regions in the epitaxial layer under contact areas;

annealing and penetrating said implanted base, collector and emitter regions;

removing the thin oxide from the contact areas; and metallization of the contact areas.

2. Process in accordance with claim 1, wherein the base implantation is performed at uniform depth.

3. Process in accordance with claim 1, wherein the phase of growth of the insulating regions is preceded by a field implantation phase.

* * * * *